United States Patent
Huang (10) Patent No.: US 9,698,778 B2
(45) Date of Patent: Jul. 4, 2017

(54) ON-DIE TERMINATION/DRIVING CIRCUIT AND METHOD OF USING THE SAME

(71) Applicant: TAIWAN SEMICONDUCTOR MANUFACTURING COMPANY, LTD., Hsinchu (TW)

(72) Inventor: Tien-Chien Huang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/711,855

(22) Filed: May 14, 2015

(65) Prior Publication Data

US 2016/0094222 A1 Mar. 31, 2016

Related U.S. Application Data (60) Provisional application No. 62/057,532, filed on Sep. 30, 2014.

(51) Int. Cl.
| H03K 19/00 | (2006.01) |
| H03K 19/0175 | (2006.01) |
| H03K 19/003 | (2006.01) |

(52) U.S. Cl.
CPC ....... *H03K 19/0005* (2013.01); *H03K 19/003* (2013.01); *H03K 19/017509* (2013.01)

(58) Field of Classification Search
CPC ............. H03K 19/0005; H03K 19/003; H03K 19/017509
USPC .......................................................... 326/30
See application file for complete search history.

(56) References Cited

U.S. PATENT DOCUMENTS

| 6,051,989 A * | 4/2000 | Walck ................. G06F 13/4086 326/30 |
| 6,265,893 B1 * | 7/2001 | Bates ................. H03K 19/0005 326/27 |
| 6,356,105 B1 * | 3/2002 | Volk ................. H03K 19/00361 326/21 |
| 8,405,442 B2 | 3/2013 | Chen |
| 8,436,671 B2 | 5/2013 | Chern et al. |
| 8,610,488 B2 | 12/2013 | Yu et al. |
| 8,625,240 B2 | 1/2014 | Chung et al. |
| 8,847,659 B1 | 9/2014 | Lan et al. |
| 2003/0117172 A1 * | 6/2003 | Wu ..................... G06F 13/4086 326/83 |

(Continued)

FOREIGN PATENT DOCUMENTS

WO    WO 2014015071 A2 *  1/2014  ......... H04L 25/0278

*Primary Examiner* — Jany Richardson
(74) *Attorney, Agent, or Firm* — Hauptman Ham, LLP (57) ABSTRACT

An on-die termination (ODT)/driving circuit includes a connection pad, and a sub-circuit. A first side of the sub-circuit is connected to the connection pad. The ODT/driving circuit further includes a first switch directly connected to a second side of the sub-circuit. The second side of the sub-circuit is opposite the first side of the sub-circuit. The first switch is configured to selectively connect the second side of the sub-circuit to a supply voltage. The ODT/driving circuit further includes a second switch directly connected to the second side of the sub-circuit. The second switch is configured to selectively connect the second side of the sub-circuit to a reference voltage. The ODT/driving circuit further includes a receiver connected to a node located between the connection pad and the first side of the sub-circuit.

20 Claims, 6 Drawing Sheets

(56) References Cited

U.S. PATENT DOCUMENTS

2007/0126469 A1* 6/2007 Kim .................. H04L 25/0298
   326/30
2014/0266386 A1 9/2014 Huang et al.

* cited by examiner

ON-DIE TERMINATION/DRIVING CIRCUIT AND METHOD OF USING THE SAME

PRIORITY CLAIM

The present application claims the priority of U.S. Application No. 62/057,532, filed Sep. 30, 2014, which is incorporated herein by reference in its entirety.

BACKGROUND

A driving circuit is part of an input/output (I/O) portion of a circuit used to connect a core portion of the circuit to a supply voltage or a reference voltage. A resistor is positioned within the driving circuit between the supply voltage and the core portion of the circuit. In addition, a resistor is positioned within the driving circuit between the reference voltage and the core portion of the circuit.

An on-die termination (ODT) circuit is also part of an I/O portion of a circuit. The ODT is used to help prevent signal reflection from the core portion of the circuit back into the core portion of the circuit. Signal reflection creates noise within the core portion of the circuit and is capable of decreasing reliability of the core portion of the circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
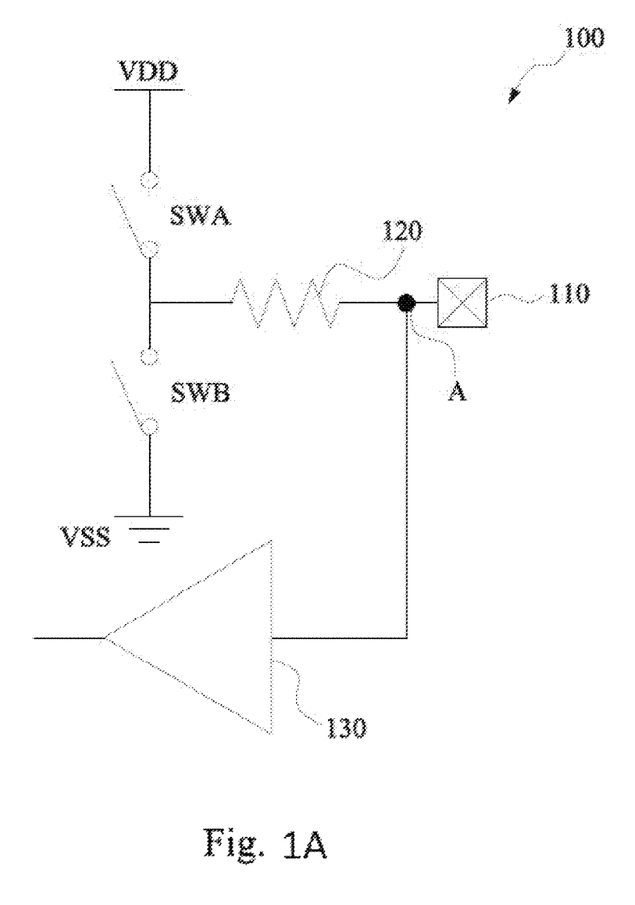
FIGS. 1A-1D are schematic diagrams of an on-die termination (ODT)/driving circuit in accordance with some embodiments.

FIG. 1A is a schematic diagram of an on-die termination (ODT)/driving circuit 100 in accordance with some embodiments. ODT/driving circuit 100 includes a connection pad 110 configured to connect the ODT/driving circuit to a core portion of a circuit. ODT/driving circuit 100 includes a sub-circuit 120 having a first end connected to connection pad 110. A first switch SWA is connected to a second side of sub-circuit 120 opposite connection pad 110. First switch SWA is connected between the second side of sub-circuit 120 and a supply voltage VDD. A second switch SWB is connected to the second side of sub-circuit 120. Second switch SWB is connected between the second side of sub-circuit 120 and a reference voltage VSS. A receiver 130 is connected to a node A located between the first side of sub-circuit 120 and connection pad 110.

ODT/driving circuit 100 is capable of operating as both a driving circuit and as an ODT circuit. By selectively activating first switch SWA or second switch SWB, ODT/driving circuit 100 is able to connect connection pad 110 to either supply voltage VDD or reference voltage VSS. By selectively activating receiver 130, ODT/driving circuit 100 is also switched between the driving circuit (when the receiver de-activated) and the ODT circuit (when the receiver activated).

Connection pad 110 is used to connect the core portion of the circuit with ODT/driving circuit 100, which is part of an input/output (I/O) portion of the circuit. Connection pad 110 is usable to convey a signal between ODT/driving circuit 100 and the core portion of the circuit. In some embodiments, connection pad 110 is a connection pin between ODT/driving circuit 100 and the core portion of the circuit. In some embodiments, connection pad 110 is part of a same die as the core portion of the circuit. In some embodiments, connection pad 110 is part of a die separate from the core portion of the circuit. In some embodiments, the core portion of the circuit is a memory array, a processing circuit or another suitable circuit type.

Figure 1B:
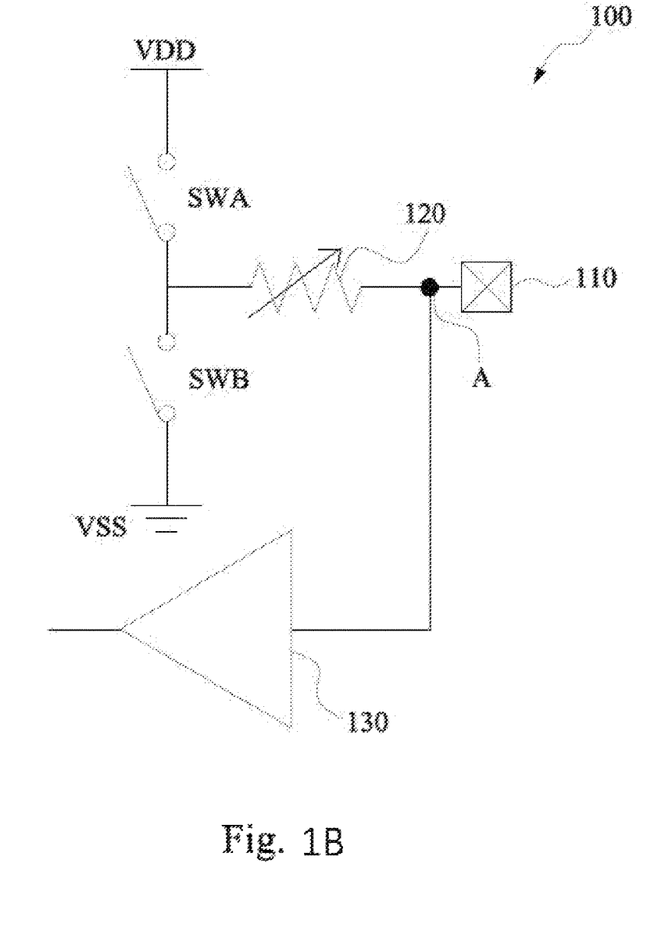

Sub-circuit 120 is usable to control a voltage passing into or out of the core portion of the circuit. Sub-circuit 120 has a linear impedance specification. Sub-circuit 120 is used whether ODT/driving circuit is operating as an ODT circuit or as a driving circuit. In some embodiments, sub-circuit 120 is a passive resistor. In some embodiments, sub-circuit 120 includes a transistor, a diode, or another suitable active resistive element. In some embodiments, ODT/driving circuit 100 includes a single resistor. In some embodiments, sub-circuit 120 includes a plurality of resistors connected in series. In some embodiments, sub-circuit 120 includes a plurality of resistors connected in parallel. In some embodiments, sub-circuit 120 includes a variable resistance resistor, as shown in FIG. 1B. In some embodiments, the variable resistance of sub-circuit 120 is altered based on temperature, a voltage level of the supply voltage, a size of active elements in the core portion of the circuit, or based on another suitable parameter.

Including sub-circuit 120 which is usable by both the driving circuit configuration and the ODT configuration of ODT/driving circuit 100 helps to reduce an overall size of the ODT/driving circuit in comparison circuits which include separate resistors for each of first switch SWA and second switch SWB. For example, combining an ODT circuit with a driving circuit reduces an overall area of the circuitry by about 30% in comparison with separate ODT and driving circuits. In another example, reusing a sub-circuit for first switch SWA and second switch SWB reduces the overall area of the circuitry by about 30% in comparison with a circuit which includes a separate sub-circuit for both the first switch and the second switch. By combining both reuse of the sub-circuit and combination of the ODT circuit with the driving circuit, as in ODT/driving circuit 100, the overall area of the circuitry is reduced by about 43% in comparison with a circuit which includes a separate ODT circuit and driving circuit and separate sub-circuits for both first switch SWA and second switch SWB, in some embodiments.

As a demand for reduction in circuit size increases, the area savings of ODT/driving circuit 100 in comparison with other circuitry helps with reduction of overall circuit size. In addition, ODT/driving circuit 100 is capable of maintaining an acceptable interface linearity with a memory array. In some embodiments, a ratio between an ideal resistance and an actual resistance of sub-circuit 120 ranges from about 0.8 to about 1.25, as a voltage at connection pad 110 ranges from about 110% of supply voltage VDD to about 50% of the supply voltage.

A driving circuit which includes a single resistor connected between a connection pad and a supply voltage switch and a reference voltage switch is not combinable with an ODT circuit which shares the single resistor. In some JEDEC interface specifications, such as DDR3/DDR2, define an effective ODT circuit as the impedance to the supply voltage should be equal to the impedance to the reference voltage. However, merely combining an ODT circuit with the above driving circuit would result in a structure incapable of achieving the equivalent impedances defined in some JEDEC interface specifications, such as DDR3/DDR2.

Figure 1C:
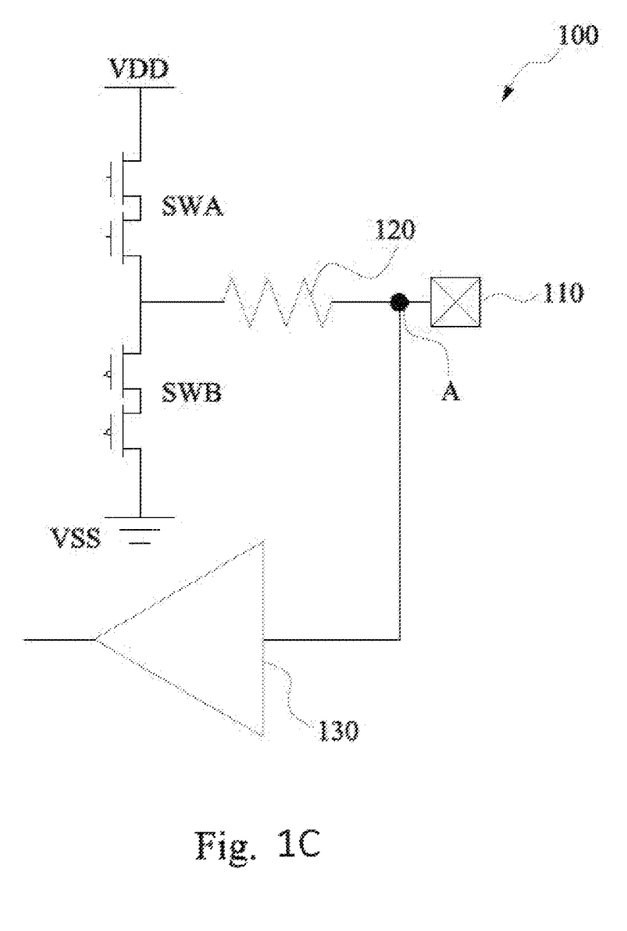
Figure 1D:
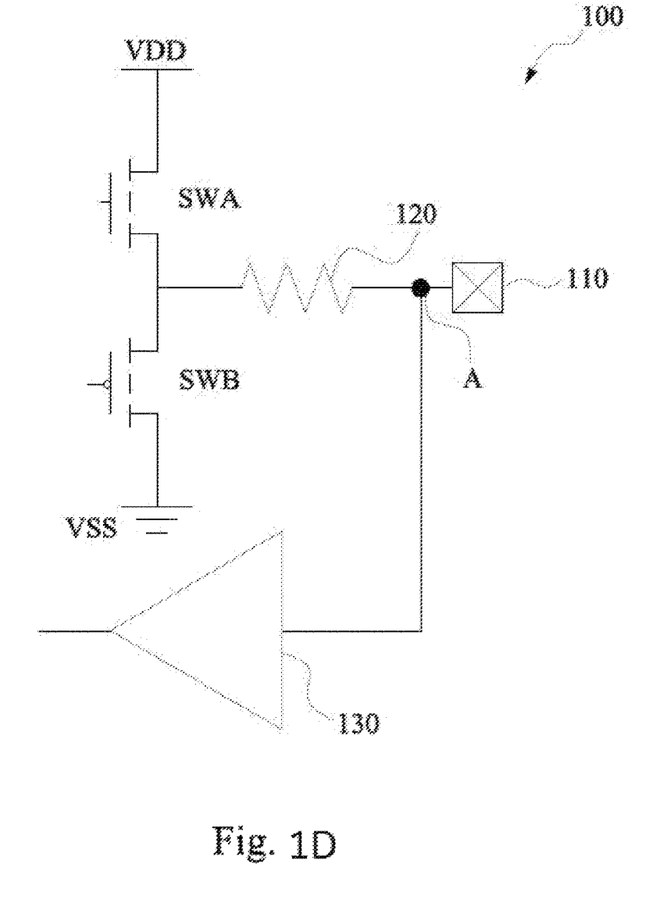

First switch SWA is used to selectively connect sub-circuit 120 with supply voltage VDD. In some embodiments, first switch SWA is a transistor, such as a metal oxide semiconductor (MOS) transistor, a bipolar junction transistor (BJT), a fin field effect transistor (FinFET), or another suitable transistor. In some embodiments, first switch SWA includes a plurality of transistors, as shown in FIG. 1C. In some embodiments, first switch SWA includes at least one multi-fingered transistor, as shown in FIG. 1D. In some embodiments, first switch SWA includes two or more cascoded-connection transistors. The use of the plurality of transistors or the multi-fingered transistor helps to facilitate tuning of a resistance of first switch SWA by selectively activating transistors of the plurality of transistors or fingers of the multi-fingered transistor. Tuning of the resistance of first switch SWA helps to compensate for variations in first switch SWA due to production variation. Tuning of the resistance of first switch SWA also helps to reduce an impact of temperature variation or voltage variation during operation of ODT/driving circuit 100. In some embodiments, the selective activation of transistors of the plurality of transistors or fingers of the multi-fingered transistor is controlled by an external circuit.

Second switch SWB is used to selectively connect sub-circuit 120 with reference voltage VSS. In some embodiments, second switch SWB is a transistor, such as a MOS transistor, a BJT, a FinFET, or another suitable transistor. In some embodiments, second switch SWB is a same type of transistor as first switch SWA. In some embodiments, second switch SWB is a different type of transistor from first switch SWA. In some embodiments, second switch SWB includes a plurality of transistors, as shown in FIG. 1C. In some embodiments, second switch SWB includes two or more cascoded-connection transistors. In some embodiments, a number of transistors in second switch SWB is a same number as in first switch SWA. In some embodiments, the number of transistors in second switch SWB is different from the number of transistors in first switch SWA. In some embodiments, second switch SWB includes at least one multi-fingered transistor, as shown in FIG. 1D. In some embodiments, a number of fingers in second switch SWB is equal to a number of fingers in first switch SWA. In some embodiments, the number of fingers in second switch SWB is different from the number of fingers in first switch SWA. As with first switch SWA, the use of the plurality of transistors or the multi-fingered transistor helps to facilitate tuning of a resistance of second switch SWB by selectively activating transistors of the plurality of transistors or fingers of the multi-fingered transistor. In some embodiments, the selective activation of transistors of the plurality of transistors or fingers of the multi-fingered transistor is controlled by an external circuit. In some embodiments, the external circuit for controlling second switch SWB is a same external circuit for controlling first switch SWA. In some embodiments, the external circuit for controlling second switch SWB is a different from the external circuit for controlling first switch SWA.

Receiver 130 is usable to reduce signal reflection of signals to or from connection pad 110. Receiver 130 is able to be selectively activated in order to alter the function of ODT/driving circuit 100 between an ODT circuit and a driving circuit. However, both the ODT circuit function and the driving circuit function share sub-circuit 120. In some embodiments, receiver 130 is connected to supply voltage VDD through sub-circuit 120 and first switch SWA in order to operate as an ODT circuit terminating to power. In some embodiments, receiver 130 is connected to reference voltage VSS through sub-circuit 120 and second switch SWB in order to operate as an ODT circuit terminating to ground.

Figure 2A:
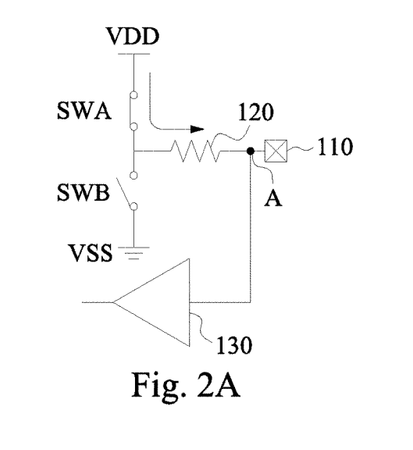
FIGS. 2A-2D are schematic diagrams of an ODT/driving circuit in operation in accordance with some embodiments.

FIG. 2A is a schematic diagram of ODT/driving circuit 100 in operation in accordance with some embodiments. In FIG. 2A ODT/driving circuit 100 is operating as a pull up driving circuit. First switch SWA is closed and second switch SWB is open. Receiver 130 is also deactivated. As a result, connection pad 110 is connected to supply voltage VDD through sub-circuit 120 and first switch SWA. As a result, supply voltage VDD is usable to drive a core portion of the circuit connected to connection pad 110.

Figure 2B:
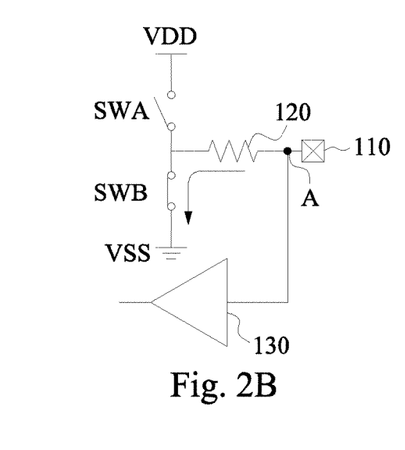

FIG. 2B is a schematic diagram of ODT/driving circuit 100 in operation in accordance with some embodiments. In FIG. 2B ODT/driving circuit 100 is operating as a pull down driving circuit. First switch SWA is open and second switch SWB is closed. Receiver 130 is also deactivated. As a result, connection pad 110 is connected to reference voltage VSS through sub-circuit 120 and second switch SWB. As a result, reference voltage VSS is usable to drive a core portion of the circuit connected to connection pad 110.

Figure 2C:
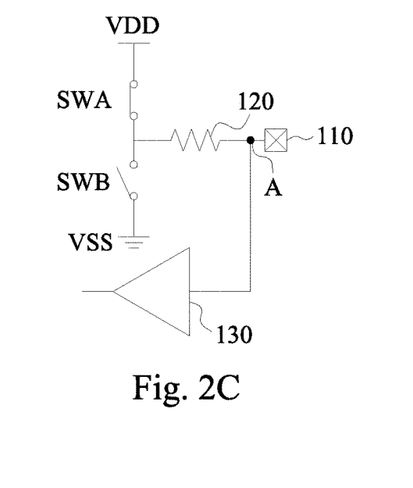

FIG. 2C is a schematic diagram of ODT/driving circuit 100 in operation in accordance with some embodiments. In FIG. 2C ODT/driving circuit 100 is operating as an ODT circuit terminating at power. First switch SWA is closed and second switch SWB is open. As a result, a signal from connection pad 110 is connected to supply voltage VDD through sub-circuit 120 and first switch SWA. As a result, reflection of the signal from connection pad 110 is reduced. In some embodiments, receiver 130 is activated in the operation indicated in FIG. 2C. In some embodiments, receiver 130 is deactivated in the operation indicated in FIG. 2C. Receiver 130 is able to be activated input/output (I/O) circuits. In some embodiments, receiver 130 is connected to a same I/O circuit as another portion of ODT/driving circuit 100, such as first switch SWA or second switch SWB. In some embodiments, receiver 130 is connected to a different I/O circuit from at least one part of ODT/driving circuit 100. In some embodiments in which receiver 130 is independently controlled by an I/O circuit separate from other portions of ODT/driving circuit 100, reflection along an I/O bus is reduced.

Figure 2D:
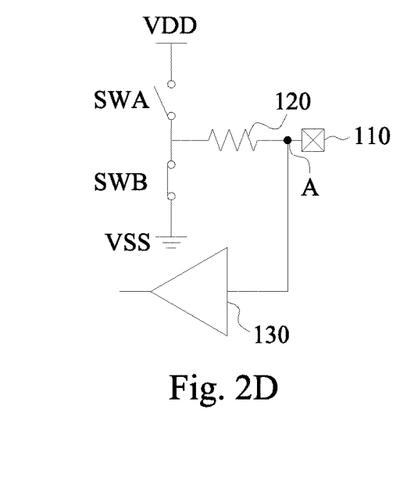

FIG. 2D is a schematic diagram of ODT/driving circuit 100 in operation in accordance with some embodiments. In FIG. 2D ODT/driving circuit 100 is operating as an ODT circuit terminating at ground. First switch SWA is open and second switch SWB is closed. As a result, a signal from connection pad 110 is connected to reference voltage VSS through sub-circuit 120 and second switch SWB. As a result, reflection of the signal from connection pad 110 is reduced. In some embodiments, receiver 130 is activated in the operation indicated in FIG. 2D. In some embodiments, receiver 130 is deactivated in the operation indicated in FIG. 2D.

Figure 3:
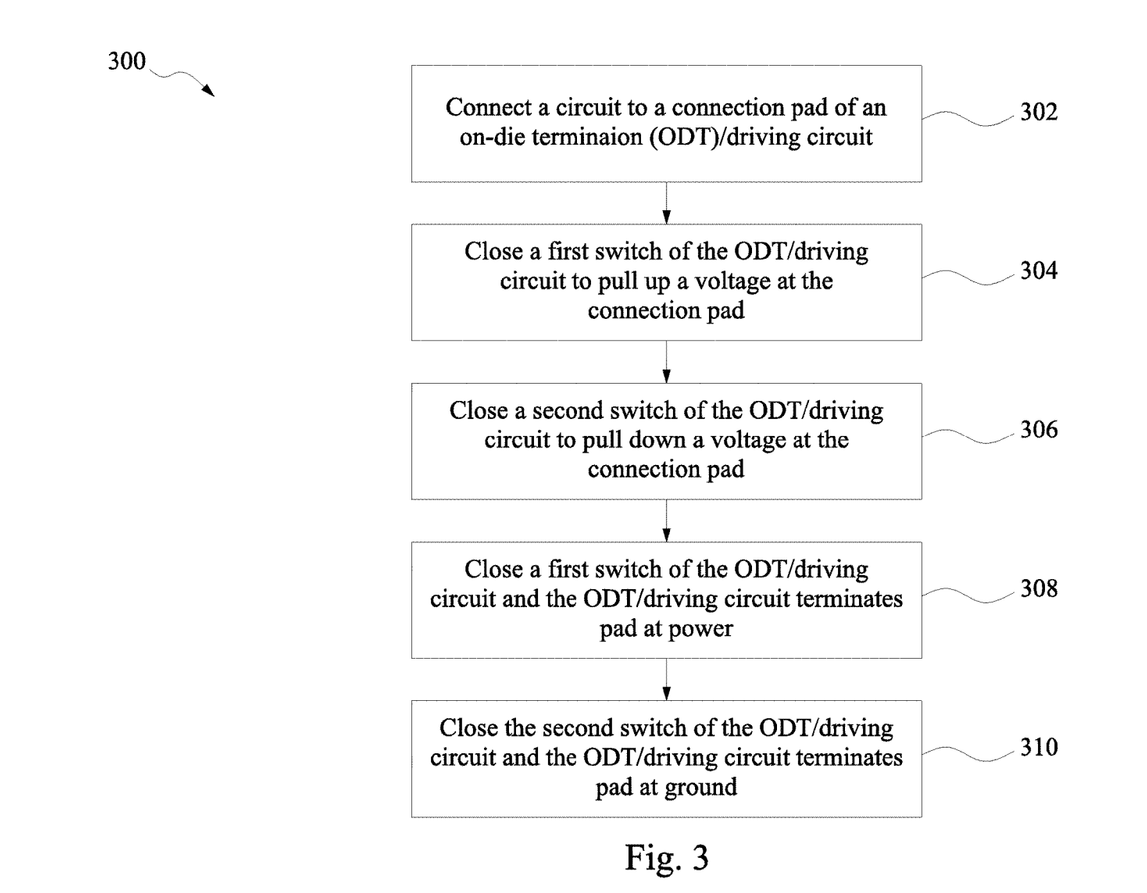
FIG. 3 is a flowchart of a method of using an ODT/driving circuit in accordance with some embodiments.

FIG. 3 is a flowchart of a method 300 of using an ODT/driving circuit in accordance with some embodiments. Method 300 include operation 302 in which a circuit is connected to an ODT/driving circuit, e.g., ODT/driving circuit 100 (FIG. 1), at a connection pad, e.g., connection pad 110. In some embodiments, the circuit is part of a same die as the ODT/driving circuit. In some embodiments, the circuit is part of a different die from the ODT/driving circuit. In some embodiments, the ODT/driving circuit is part of an I/O portion of the circuit, and a core portion of the circuit is connected to the connection pad. In some embodiments, the core portion includes a memory array, a logic circuit or other suitable core circuitry.

In some embodiments, operation 302 is performed during a manufacturing stage and is omitted from method 300. In some embodiments, operation 302 is performed during operation of the circuit, e.g., by a switching element.

In operation 304, a first switch, e.g., first switch SWA (FIG. 1), of the ODT/driving circuit is closed and the ODT/driving circuit operates as a pull up driving circuit. During operation 304, a second switch, e.g., second switch SWB, of the ODT/driving circuit is opened. During operation 304, a receiver, e.g., receiver 130, of the ODT/driving circuit is deactivated. A voltage at the connection pad is pulled up to a supply voltage, e.g., supply voltage VDD, through a sub-circuit, e.g., sub-circuit 120, and the first switch. In some embodiments, closing the first switch includes selectively activating at least one transistor of a plurality of transistors or selectively activating at least one finger of a multi-fingered transistor. In some embodiments, the first switch is closed based on a signal from an external circuit.

In operation 306, the second switch of the ODT/driving circuit is closed and the ODT/driving circuit operates as a pull down driving circuit. During operation 306, the first switch of the ODT/driving circuit is opened. During operation 306, the receiver of the ODT/driving circuit is deactivated. A voltage at the connection pad is pulled down to a reference voltage, e.g., reference voltage VSS, through the sub-circuit and the second switch. In some embodiments, closing the second switch includes selectively activating at least one transistor of a plurality of transistors or selectively activating at least one finger of a multi-fingered transistor. In some embodiments, the second switch is closed based on a signal from an external circuit. In some embodiments, the external circuit for closing the second switch is a same external circuit as for closing the first switch in operation 304. In some embodiments, the external circuit for closing the second switch is a different from the external circuit for closing the first switch in operation 304.

In operation 308, the first switch of the ODT/driving circuit is closed so that the ODT/driving circuit operates as an ODT circuit terminating pad at power. During operation 308, the second switch of the ODT/driving circuit is opened. Reflection of a signal from the connection pad is reduced by impedance matching to the supply voltage. In some embodiments, closing the first switch includes selectively activating at least one transistor of a plurality of transistors or selectively activating at least one finger of a multi-fingered transistor. In some embodiments, the first switch is closed based on a signal from an external circuit. In some embodiments, the receiver is activated based on a signal from an external circuit. In some embodiments, the external circuit for closing the first switch is a same external circuit as for activating the receiver. In some embodiments, the external circuit for closing the first switch is a different from the external circuit for activating the receiver.

In operation 310, the second switch of the ODT/driving circuit is closed so that the ODT/driving circuit operates as an ODT circuit terminating pad at ground. During operation 310, the first switch of the ODT/driving circuit is opened. Reflection of a signal from the connection pad is reduced by impedance matching to the reference voltage. In some embodiments, closing the second switch includes selectively activating at least one transistor of a plurality of transistors or selectively activating at least one finger of a multi-fingered transistor. In some embodiments, the second switch is closed based on a signal from an external circuit. In some embodiments, the receiver is activated based on a signal from an external circuit. In some embodiments, the external circuit for closing the second switch is a same external circuit as for activating the receiver. In some embodiments, the external circuit for closing the second switch is a different from the external circuit for activating the receiver.

In some embodiments, an order of the operations of method 300 is changed. In some embodiments, at least one operation of method 300 is repeated prior to performing at least one other operation of the method. In some embodiments, the order of the operations of method 300 is controlled by an external circuit. In some embodiments, the external circuit for controlling the order of operations is same external circuit used to control at least one of the first switch, the second switch or the receiver. In some embodiments, the external circuit for controlling the order of operations is different from the external circuit used to control the first switch, the second switch and the receiver.

One aspect of this description relates to an on-die termination (ODT)/driving circuit. The ODT/driving circuit includes a connection pad, and a sub-circuit. A first side of the sub-circuit is connected to the connection pad. The ODT/driving circuit further includes a first switch directly connected to a second side of the sub-circuit. The second side of the sub-circuit is opposite the first side of the sub-circuit. The first switch is configured to selectively connect the second side of the sub-circuit to a supply voltage. The ODT/driving circuit further includes a second switch directly connected to the second side of the sub-circuit. The second switch is configured to selectively connect the second side of the sub-circuit to a reference voltage. The ODT/driving circuit further includes a receiver connected to a node located between the connection pad and the first side of the sub-circuit.

Another aspect of this description relates to an on-die termination (ODT)/driving circuit. The ODT/driving circuit includes a connection pad, and a single resistor connected to the connection pad. The ODT/driving circuit further includes a first switch configured to selectively connect the connection pad to a supply voltage along a first path. The first path extends through the resistor. The ODT/driving circuit further includes a second switch configured to selective connect the connection pad to a reference voltage along a second path. The second path extends through the resistor.

The ODT/driving circuit further includes a receiver connected to a node between the connection pad and the resistor. The receiver is configured to be selectively activated for switching the ODT/driving circuit between an ODT circuit operation state and a driving circuit operation state.

Still another aspect of this description relates to a method of using an on-die termination (ODT)/driving circuit. The method includes closing a first switch and opening a second switch to form a first driving circuit path from a supply voltage to a connection pad, wherein the first driving circuit path extends through a sub-circuit. The method further includes closing the second switch and opening the first switch to form a second driving circuit path from a reference voltage to the connection pad, wherein the second driving circuit path extends through the sub-circuit. The method further includes closing the first switch, opening the second switch and activating a receiver to form a first ODT path terminating at the supply voltage, wherein the first ODT path extends through the sub-circuit. The method further includes closing the second switch, opening the first switch and activating the receiver to form a second ODT path terminating at the reference voltage, wherein the second ODT path extends through the sub-circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An on-die termination (ODT)/driving circuit comprising:
   a connection pad;
   a sub-circuit, wherein a first side of the sub-circuit is coupled to the connection pad;
   a first switch coupled to a second side of the sub-circuit, wherein the second side of the sub-circuit is opposite the first side of the sub-circuit, and the first switch is configured to selectively couple the second side of the sub-circuit to a supply voltage;
   a second switch coupled to the second side of the sub-circuit, wherein the second switch is configured to selectively couple the second side of the sub-circuit to a reference voltage; and
   a receiver coupled to a node located between the connection pad and the first side of the sub-circuit;
   wherein the receiver is configured to be deactivated when the ODT/driving circuit is in a driving mode, and the receiver is configured to be activated when the ODT/driving circuit is in an ODT mode, wherein the activated receiver is coupled to the supply voltage through the first switch when the second switch is opened or the activated receiver is coupled to the reference voltage through the second switch when the first switch is opened.

2. The ODT/driving circuit of claim 1, wherein the sub-circuit is a single resistor.

3. The ODT/driving circuit of claim 1, wherein the sub-circuit is a variable resistor.

4. The ODT/driving circuit of claim 1, wherein the first switch includes a plurality of transistors, wherein the plurality of transistors is configured to vary a resistance between the second side of the sub-circuit and the supply voltage in response to a signal.

5. The ODT/driving circuit of claim 1, wherein the first switch includes a multi-fingered transistor, wherein the multi-fingered transistor is configured to vary a resistance between the second side of the sub-circuit and the supply voltage in response to a signal.

6. The ODT/driving circuit of claim 1, wherein the second switch includes a plurality of transistors, wherein the plurality of transistors is configured to vary a resistance between the second side of the sub-circuit and the reference voltage in response to a signal.

7. The ODT/driving circuit of claim 1, wherein the second switch includes a multi-fingered transistor, wherein the multi-fingered transistor is configured to vary a resistance between the second side of the sub-circuit and the reference voltage in response to a signal.

8. The ODT/driving circuit of claim 1, wherein the ODT/driving circuit is configured to operate as a driving circuit configured to pass a voltage through the sub-circuit, and is configured to operate as an ODT circuit configured to pass a signal through the sub-circuit.

9. An on-die termination (ODT)/driving circuit comprising:
   a connection pad;
   a single resistor coupled to the connection pad;
   a first switch configured to selectively couple the connection pad to a supply voltage along a first path, wherein the first path extends through the resistor;
   a second switch configured to selectively couple the connection pad to a reference voltage along a second path, wherein the second path extends through the resistor; and
   a receiver coupled to a node between the connection pad and the resistor, wherein the receiver is configured to be selectively activated for switching the ODT/driving circuit between an ODT circuit operation state and a driving circuit operation state, wherein the activated receiver is coupled to the supply voltage through the first switch when the second switch is opened or the activated receiver is coupled to the reference voltage through the second switch when the first switch is opened.

10. The ODT/driving circuit of claim 9, wherein the receiver is configured to propagate a signal through the resistor if the ODT/driving circuit is in the ODT circuit operation state.

11. The ODT/driving circuit of claim 10, wherein the receiver is configured to propagate the signal through the first switch.

12. The ODT/driving circuit of claim 10, wherein the receiver is configured to propagate the signal through the second switch.

13. The ODT/driving circuit of claim 9, wherein the first switch is configured to vary a resistance between the resistor and the supply voltage based on a variation in temperature of the ODT/driving circuit.

14. The ODT/driving circuit of claim 9, wherein the first switch is configured to vary a resistance between the resistor and the supply voltage based on a variation in voltage of the supply voltage.

15. The ODT/driving circuit of claim 9, wherein the second switch is configured to vary a resistance between the resistor and the reference voltage based on a variation in temperature of the ODT/driving circuit.

16. The ODT/driving circuit of claim 9, wherein the second switch is configured to vary a resistance between the resistor and the reference voltage based on a variation in voltage of the reference voltage.

17. A method of using an on-die termination (ODT)/driving circuit, the method comprising:
   closing a first switch and opening a second switch to form a first driving circuit path from a supply voltage to a connection pad, wherein the first driving circuit path extends through a sub-circuit;
   closing the second switch and opening the first switch to form a second driving circuit path from a reference voltage to the connection pad, wherein the second driving circuit path extends through the sub-circuit;
   closing the first switch, opening the second switch and activating a receiver to form a first ODT path terminating at the supply voltage, wherein the first ODT path extends through the sub-circuit, wherein the receiver is coupled to a node between the connection pad and the sub-circuit; and
   closing the second switch, opening the first switch and activating the receiver to form a second ODT path terminating at the reference voltage, wherein the second ODT path extends through the sub-circuit.

18. The method of claim 17, wherein closing the first switch comprises activating at least one finger of a multi-fingered transistor.

19. The method of claim 17, wherein closing the second switch comprises activating at least one finger of a multi-fingered transistor.

20. The method of claim 19, wherein activating the at least one finger comprises activating the at least one finger based on a temperature of the ODT/driving circuit.

* * * * *